(12) United States Patent
Lin et al.

(10) Patent No.: US 7,803,701 B2
(45) Date of Patent: Sep. 28, 2010

(54) METHOD FOR FABRICATING A SEMICONDUCTOR DEVICE

(75) Inventors: Shian-Jyh Lin, Taipei County (TW);
Shun-Fu Chen, Taipei County (TW);
Tse-Chuan Kuo, Taipei (TW);
An-Hsiung Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 239 days.

(21) Appl. No.: 11/964,516

(22) Filed: Dec. 26, 2007

(65) Prior Publication Data
US 2009/0068813 A1 Mar. 12, 2009

(30) Foreign Application Priority Data
Sep. 12, 2007 (TW) ............................... 96134019 A

(51) Int. Cl.
*H01L 21/8242* (2006.01)
*H01L 21/425* (2006.01)
(52) U.S. Cl. .................. 438/525; 438/243; 438/246; 438/247; 438/249; 438/401; 438/524
(58) Field of Classification Search ................ 438/243, 438/246, 247, 249, 386–392, 401, 433–437, 438/514–534
See application file for complete search history.

(56) References Cited

U.S. PATENT DOCUMENTS

| 6,399,259 | B1 | 6/2002 | Chang |
| 6,426,253 | B1 * | 7/2002 | Tews et al. .................. 438/243 |
| 6,498,061 | B2 * | 12/2002 | Divakaruni et al. ......... 438/243 |
| 6,656,815 | B2 | 12/2003 | Coolbaugh et al. |
| 2006/0043430 | A1 * | 3/2006 | Feudel et al. ............... 257/213 |
| 2007/0032001 | A1 * | 2/2007 | Iwamatsu et al. ........... 438/155 |

* cited by examiner

*Primary Examiner*—Ha Tran T Nguyen
*Assistant Examiner*—Karen M Kusumakar

(57) ABSTRACT

A method for fabricating the semiconductor device comprises providing a semiconductor substrate having a device region and a testkey region. A first trench is formed in the device region and a second trench is formed in the testkey region. A conductive layer with a first etching selectivity is formed in the first and second trenches. A first implantation process is performed in a first direction to form a first doped region with a first impurity and an undoped region in the conductive layer simultaneously and respectively in the device region and in the testkey region. A second implantation process is performed in the second trench to form a second doped region with a second impurity in the conductive layer, wherein the conductive layer in the second trench has a second etching selectivity higher than the first etching selectivity.

9 Claims, 16 Drawing Sheets

METHOD FOR FABRICATING A SEMICONDUCTOR DEVICE

BACKGROUND OF THE INVENTION

1. Field of the Invention

The invention relates to a method for fabricating a semiconductor device, and in more particularly relates to a method for fabricating an alignment mark or an overlay mark of a semiconductor device.

2. Description of the Related Art

In recent years, semiconductor device fabricating technology has continually sought new ways to achieve high device performance, lower costs, and high device densities. For example, in the case of a dynamic random access memory (DRAM), high device densities are used for forming high aspect ratio trench capacitor structures during DRAM fabrication. FIG. 1a shows a schematic top view of a substrate of a conventional semiconductor device 100. The substrate of the conventional semiconductor device 100 comprises a device region 102 and a testkey region 104. The device region 102 is a region for forming patterns comprising trench capacitors, periphery circuits or dummys. The testkey region 104 is a region for forming patterns comprising alignment marks, overlay marks or critical dimension (CD) testkeys. As shown in FIGS. 1b to 1d, the conventional alignment mark or overlay mark testkeys may have various shapes.

During the fabricating processes of the conventional DRAM, a single side buried strap (SSBS) can be used to electrically connect a trench capacitor plate and a source of a subsequent transistor. FIG. 1e is a cross section taken along line A-A' of FIG. 1a showing topography of the device region 102 and testkey region 104 after forming the conventional single side buried strap (SSBS) 124. After performing the conventional trench capacitor fabricating process, a first trench capacitor 120a and SSBS 124 are formed in a first trench 110 on the device region 102 while a second trench capacitor 120b and another SSBS 124 are formed in a second trench 112 on the testkey region 104. The conventional DRAM fabricating process comprising SSBS 124 on device region 102, however, causes an asymmetric profile to a central axis 170 on testkey region 104 as shown in FIG. 1e. The patterns on the testkey region 104, for example, alignment marks or overlay marks, are usually used to control relative positioning of the testkey region 104 between laminated layers. However, alignment marks with asymmetric profiles causes optical signal judgment problems for inspection machines used in the photolithography processes. The optical signal judgment problems result from a misalignment or overlay error problem during the photolithography processes. As a result, the problems reduce yield and device reliability of the conventional DRAM fabricating processes.

Thus, a novel and reliable method for fabricating alignment marks or overlay marks of a semiconductor device without an asymmetric profile is needed.

BRIEF SUMMARY OF INVENTION

To solve the above-described problems, a method for fabricating a semiconductor device is provided. An exemplary embodiment of a method for fabricating a semiconductor device comprises providing a semiconductor substrate having a device region and a testkey region. Next, a first trench is formed in the device region and a second trench is formed in the testkey region. A conductive layer is next conformably formed in the first trench and in the second trench and the conductive layer being provided with a first etching selectivity. Next, a first implantation process is performed in a first direction to form a first doped region with a first impurity and an undoped region in the conductive layer simultaneously and respectively in the device region and in the testkey region. The first trench is next covered with a patterned masking layer so that the conductive layer in the second trench is exposed. And next, a second implantation process is performed in the second trench to form a second doped region with a second impurity in the conductive layer, wherein the conductive layer in the second trench has a second etching selectivity, which is higher than the first etching selectivity.

Another exemplary embodiment of a method for fabricating a semiconductor device comprises providing a semiconductor substrate comprising a device region and a testkey region. Next, a first trench is formed in the device region and a second trench is formed in the testkey region. A conductive layer which has a first etching selectivity is next conformably formed in the first trench and in the second trench. Next, a patterned masking layer is formed to cover the second trench to retain the first etching selectivity of the conductive layer in the second trench. And next, a doped region and an undoped region are formed in the conductive layer in the first trench, wherein the doped region of the conductive layer in the first trench has a second etching selectivity higher than the first etching selectivity.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 4b shows a schematic top view of FIG. 4a.

DETAILED DESCRIPTION OF INVENTION

The following description is of a mode of carrying out the invention. This description is made for the purpose of illustrating the general principles of the invention and should not be taken in a limiting sense. The scope of the invention is best determined by reference to the appended claims.

Figure 1A:
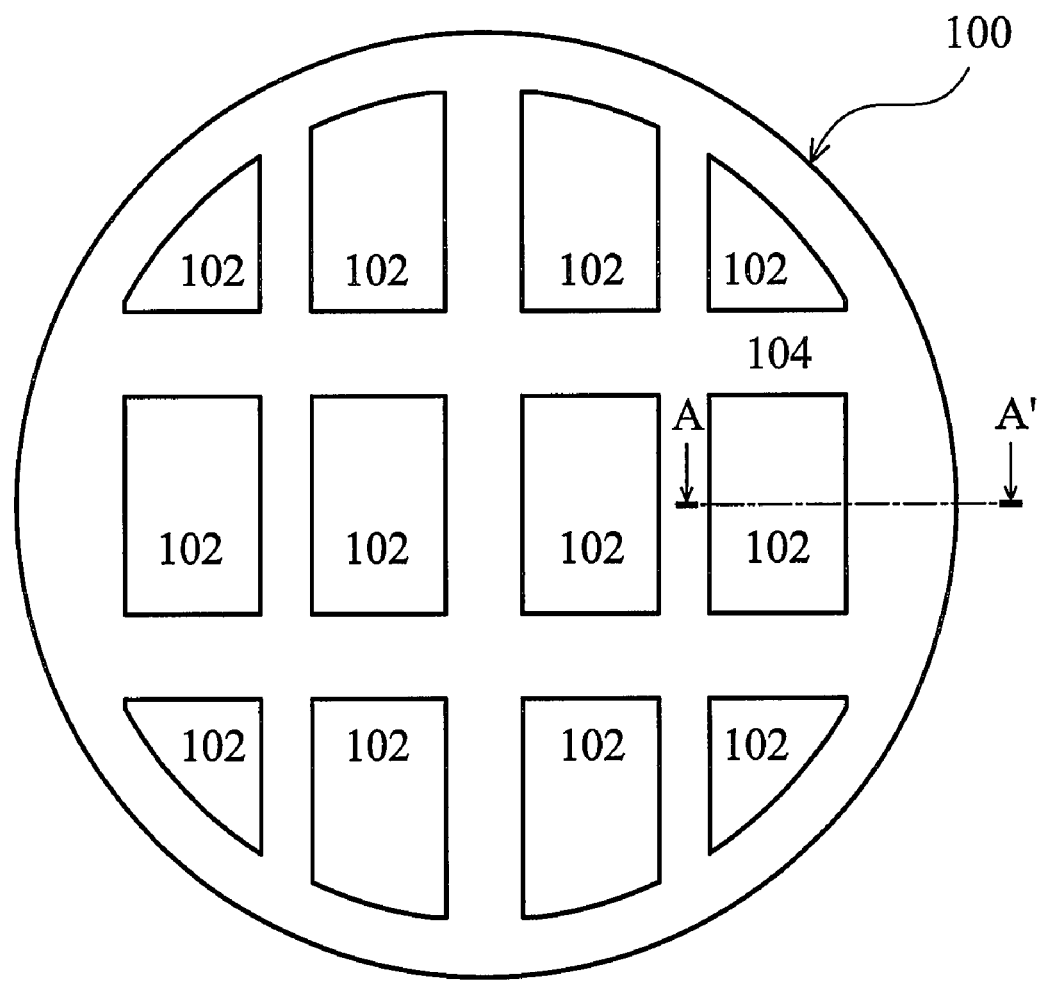
FIG. 1a shows a schematic top view of a substrate of a conventional semiconductor device.
Figure 1B:
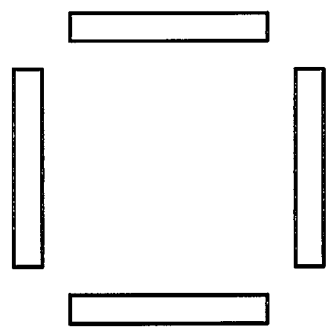
FIGS. 1b to 1d are testkey patterns showing a conventional alignment mark or a conventional overlay mark.
Figure 1C:
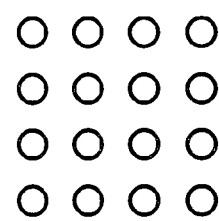
Figure 1D:
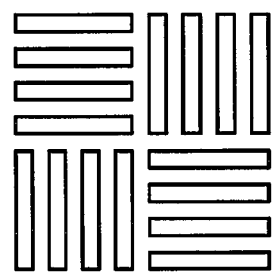
Figure 1E:
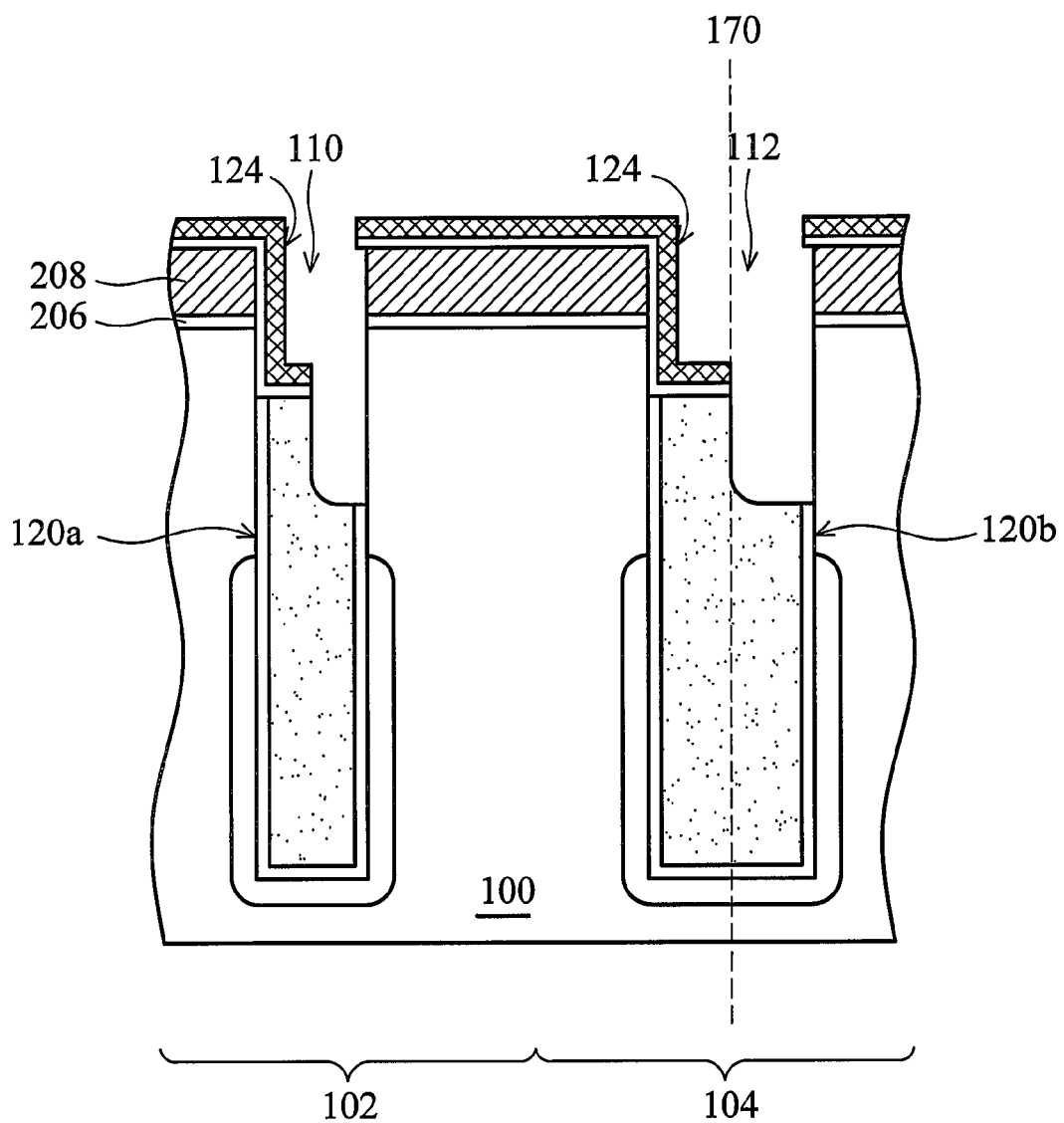
FIG. 1e is a cross section taken along line A-A' of FIG. 1a showing topography of a device region and a testkey region after forming the conventional single side buried strap (SSBS).
Figure 2:
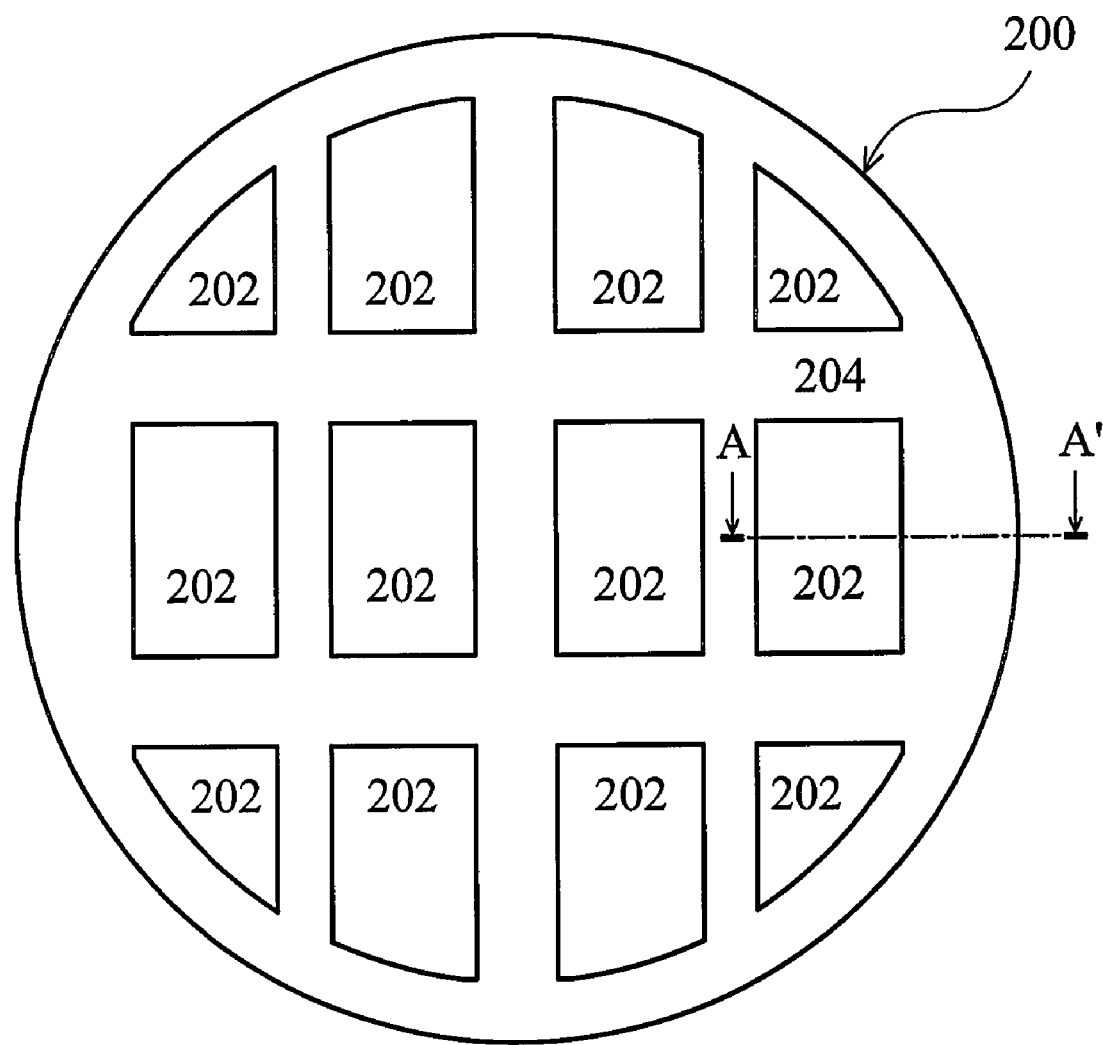
FIG. 2 shows a schematic top view of an exemplary embodiment of a substrate of a semiconductor device of the invention.

FIG. 2 shows a schematic top view of an exemplary embodiment of a substrate of a semiconductor device of the invention. FIGS. 3a, 3b, 3c, 3d, 3f, 3g and 3i are cross sections taken along line A-A' of FIG. 2 showing an exemplary embodiment of a process of fabricating a semiconductor device of the invention. FIG. 3e shows a schematic top view of FIG. 3d. FIG. 3h shows a schematic top view of FIG. 3g. FIGS. 4a and 4c are cross sections taken along line A-A' of FIG. 2 showing another exemplary embodiment of a process for fabricating a semiconductor device of the invention. FIG. 4b shows a schematic top view of FIG. 4a. Wherever possible, the same reference numbers are used in the drawings and the descriptions to refer to the same or like parts.

FIG. 2 shows a schematic top view of an exemplary embodiment of a semiconductor device of the invention. An exemplary embodiment of a semiconductor device comprises a semiconductor substrate 200 having a device region 202 and a testkey region 204. Device region 202 is a region for forming patterns comprising trench capacitors, periphery circuits or dummys. Testkey region 204 is a region for forming patterns comprising alignment mark, overlay mark or critical dimension (CD) testkeys. Substrate 200 is preferably a silicon substrate. Also, substrate 200 may comprise SiGe silicon on insulator (SOI), and other commonly used semiconductor substrates can be used. Alignment marks or the overlay marks in testkey region 204 may be strap-shaped or dot-shaped from a top view.

Figure 3A:
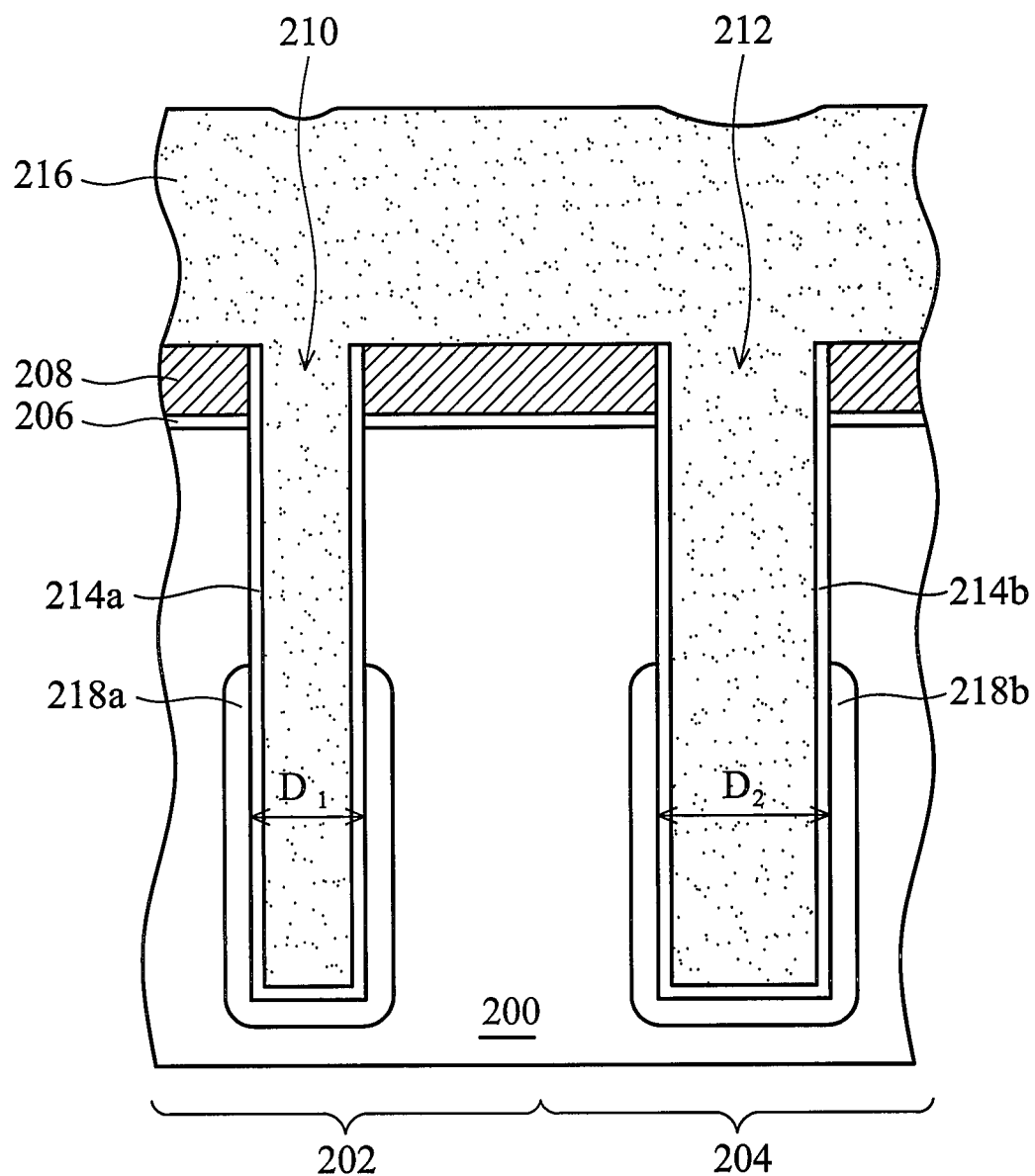
FIGS. 3a, 3b, 3c, 3d, 3f, 3g and 3i are cross sections taken along line A-A' of FIG. 2 showing an exemplary embodiment of a process for fabricating a semiconductor device of the invention.
Figure 4A:
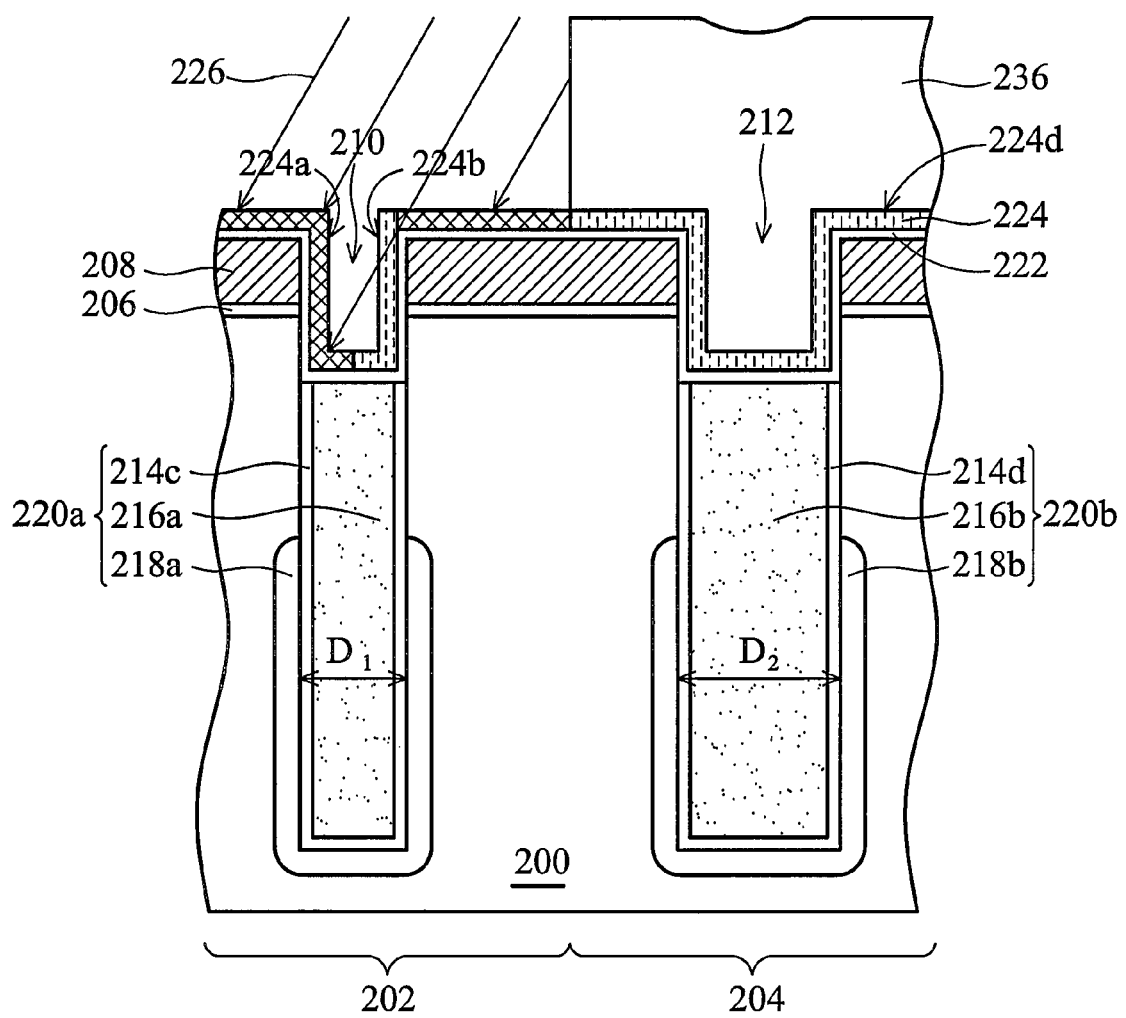
FIGS. 4a and 4c are cross sections taken along line A-A' of FIG. 2 showing another exemplary embodiment of a process for fabricating a semiconductor device of the invention.
Figure 4B:
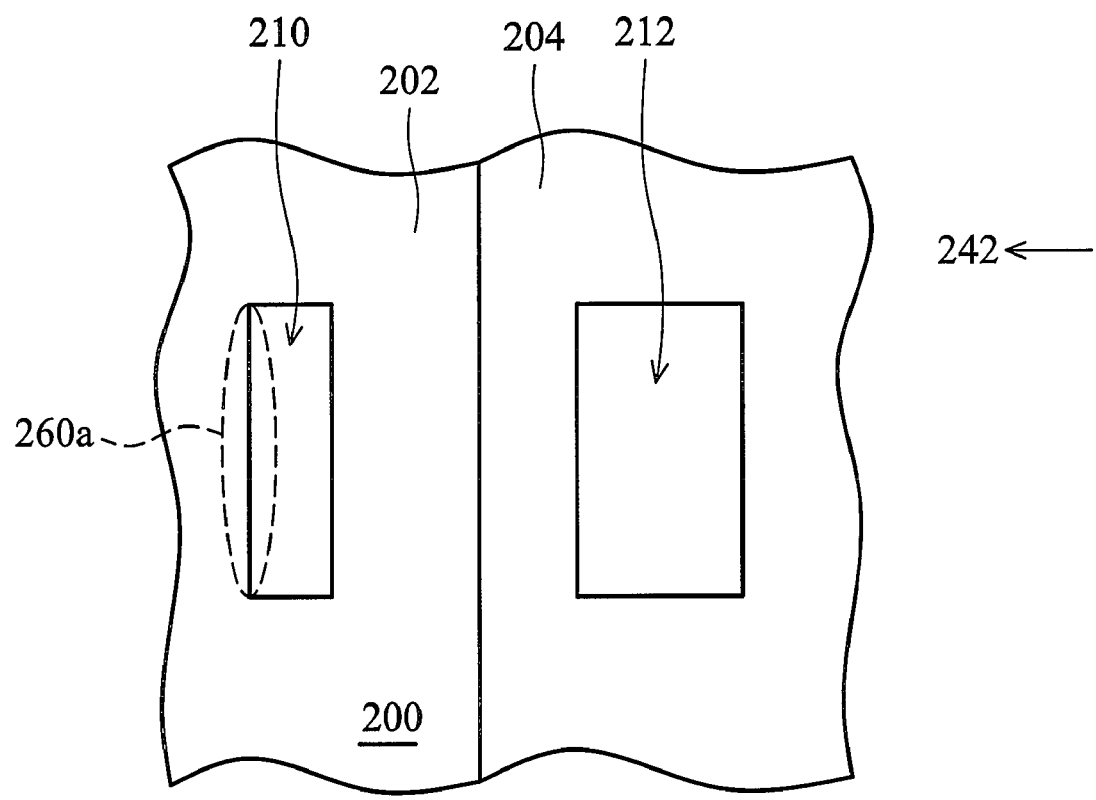
Figure 4C:
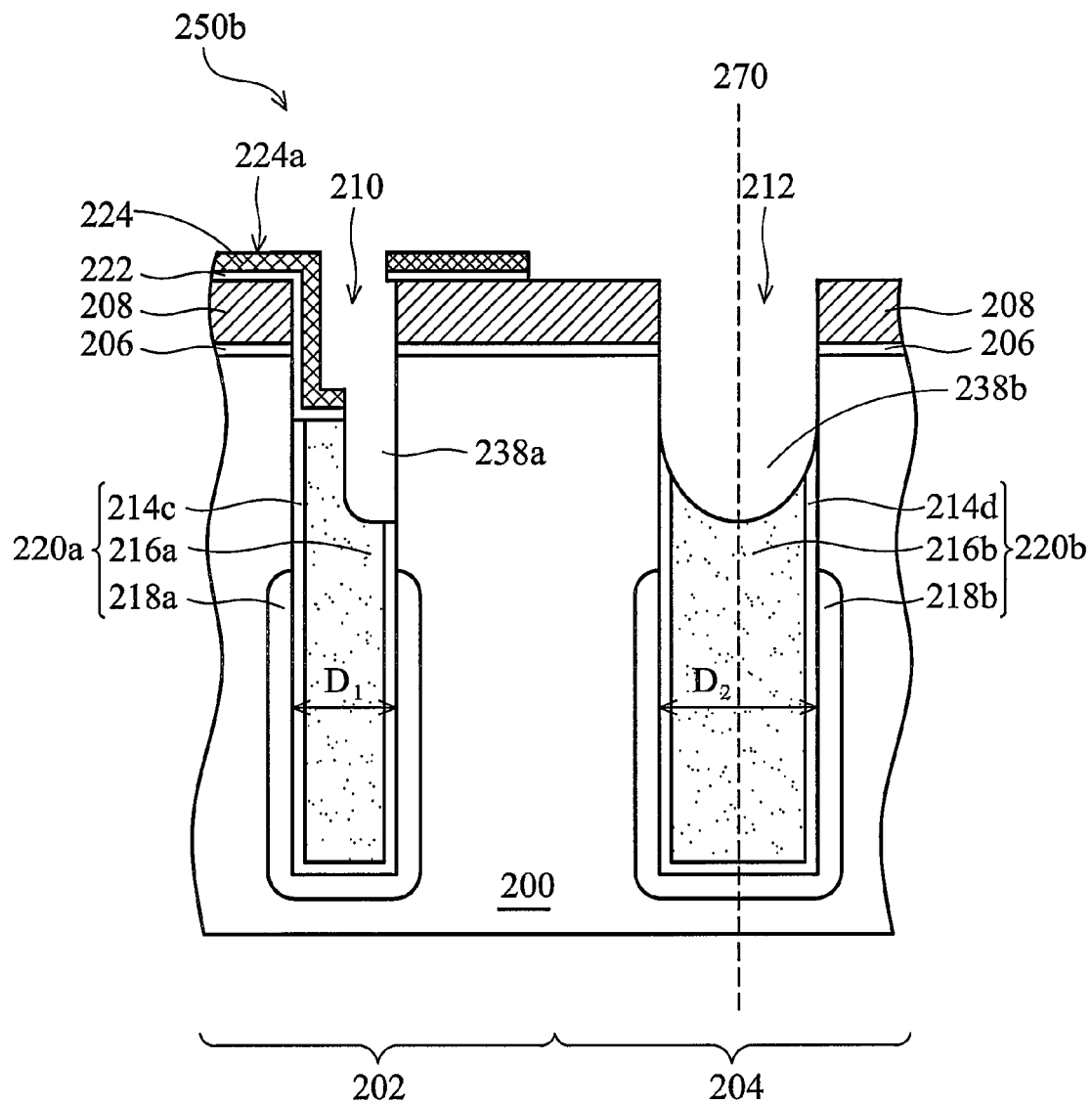

FIG. 3a is a cross sections taken along line A-A' of FIG. 2 showing an exemplary embodiment of a semiconductor device of the invention. An underlying first liner layer 206 and an overlying second liner layer 208 are formed on semiconductor substrate 200 in sequence. First liner layer 206 may comprise silicon dioxide ($SiO_2$), and second liner layer 208 may comprise silicon nitride ($Si_3N_4$). First liner layer 206 may be formed on semiconductor substrate 200 by thermal oxidation process. Next, second liner layer 208 may be formed on first liner layer 206 by chemical vapor deposition (CVD) process. Next, a patterned photoresist layer (not shown) is formed on the second liner layer 208 for defining formation positions of a first trench 210 and a second trench 212. An anisotropic etching process, for example, reactive ion etching (RIE) process, is then performed to remove a portion of first liner layer 206 and second liner layer 208 and semiconductor substrate 200 not covered by the patterned photoresist layer. The first trench 210 and second trench 212 are then formed in the device region 202 and testkey region 204, respectively. The patterned photoresist layer is then removed. The first trench 210 and second trench 212 both penetrate the first liner layer 206 and second liner layer 208, extending into the semiconductor substrate 200. The first trench 210 and second trench 212 have high aspect ratio, wherein a critical dimension $D_2$ of the second trench 212 is preferably larger than a critical dimension $D_1$ of the first trench 210.

Next, buried plates 218a and 218b are respectively formed in the semiconductor substrate 200 of the device region 202 and testkey region 204 by a fabricating process, such as ion implantation process. Buried plates 218a and 218b may be doped regions surrounding inner walls of the first trench 210 and the second trench 212, respectively. Buried plates 218a and 218b may be adjacent to a lower portion of the first trench 210 and second trench 212, respectively. In this embodiment, the buried plates 218a and 218b may serve as bottom electrodes of one exemplary embodiment of trench capacitors.

Next, capacitor dielectric layers 214a and 214b are conformably and respectively formed on the inner walls of the first trench 210 and second trench 212 by methods such as chemical vapor deposition (CVD) or atomic layer CVD (ALD). Capacitor dielectric layers 214a and 214b may comprise commonly used dielectrics, for example, oxide, nitride, oxynitride, oxycarbide or combinations thereof. Also, capacitor dielectric layers 214a and 214b may comprise dielectric materials with dielectric constant (k) larger than 3.9, for example, silicon dioxide ($SiO_2$), silicon nitride ($Si_3N_4$), silicon oxynitride ($SiO_xN_y$) or combinations thereof.

Next, an electrode layer 216 is blanketly formed on the second liner layer 208, filling the first trench 210 and second trench 212. The electrode layer 216, for example, polysilicon electrode layer 216, may be formed by a chemical vapor deposition (CVD) process. The electrode layer 216 covers the capacitor dielectric layer 214a on the device region 202 and the capacitor dielectric layer 214b on the testkey region 204. In addition, the electrode layer 216 not only comprises polycrystalline silicon (poly-Si), but also comprises amorphous silicon (α-Si).

Figure 3B:
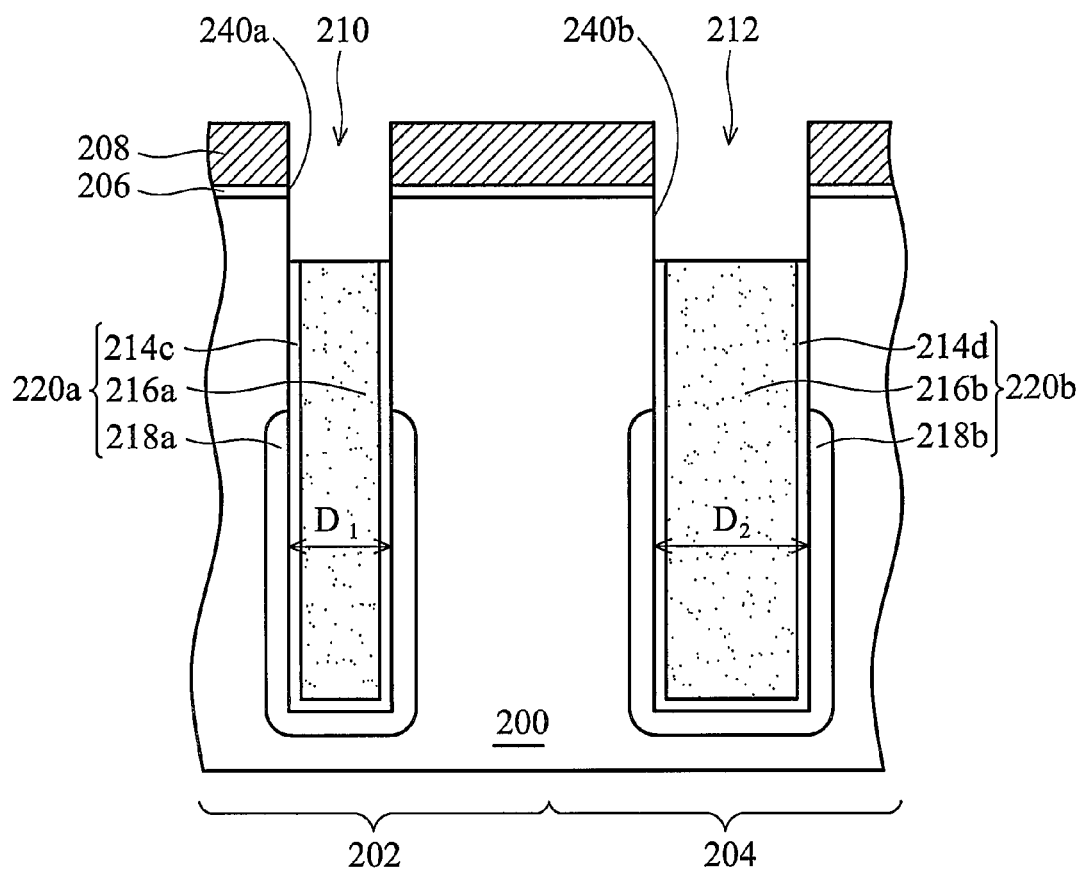

Next, as shown in FIG. 3b, a recess 240a is formed in a first trench capacitor 220a of the first trench 210 in device region 202 while a recess 240b is formed in a second trench 220b capacitor of the second trench 212 in testkey region 204. A planarization process such as chemical mechanical polish (CMP) and/or an etching back process, may be used to remove a portion of the electrode layer 216 on the second liner layer 208, a portion of the electrode layer 216 and capacitor dielectric layer 214a in the first trench 210 on the device region 202, a portion of the electrode layer 216 and capacitor dielectric layer 214b in the second trench 212 on the testkey region 204. The electrode layer 216a and capacitor dielectric layer 214c that remain, form a recess in the first trench 210 while the electrode layer 216b and capacitor dielectric layer 214d that remain, form a recess in the second trench 212. The electrode layers 216a and 216b that remain serve as top electrodes of one exemplary embodiment of trench capacitors. Thus, a first trench capacitor 220a is formed recessed in the first trench 210 while a second capacitor 220b is formed recessed in the second trench 212.

Figure 3C:
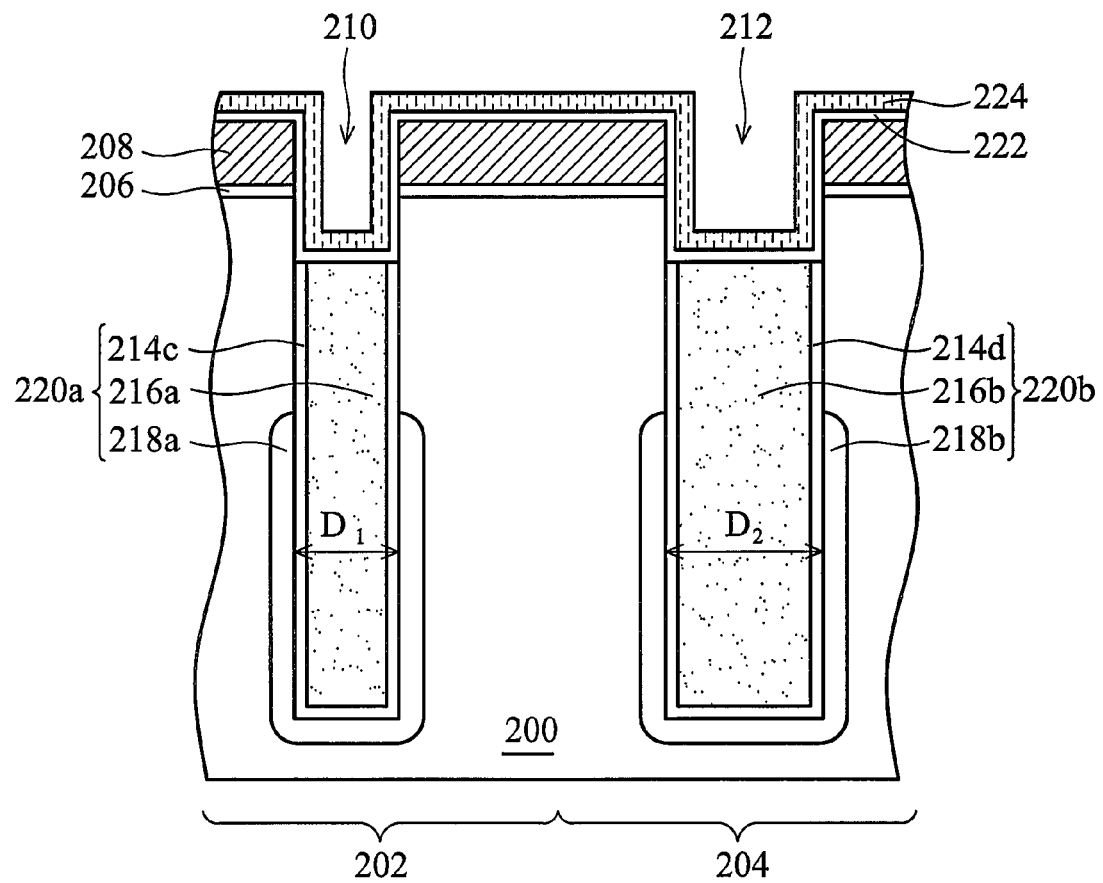

Referring to FIG. 3c, an underlying insulating layer 222 and an overlying conductive layer 224 are conformably formed on the first trench 210 and second trench 212, respectively. Insulating layer 222 may be conformably formed by methods such as chemical vapor deposition (CVD) or atomic layer CVD (ALD). Insulating layer 222 may comprise common used dielectrics, for example, oxide, nitride, oxynitride, oxycarbide or combinations thereof. Conductive layer 224 may comprise polycrystalline silicon (poly-Si) or amorphous silicon (α-Si) formed by chemical vapor deposition (CVD) process. In this embodiment, conductive layer 224 may have a first etching selectivity.

Figure 3D:
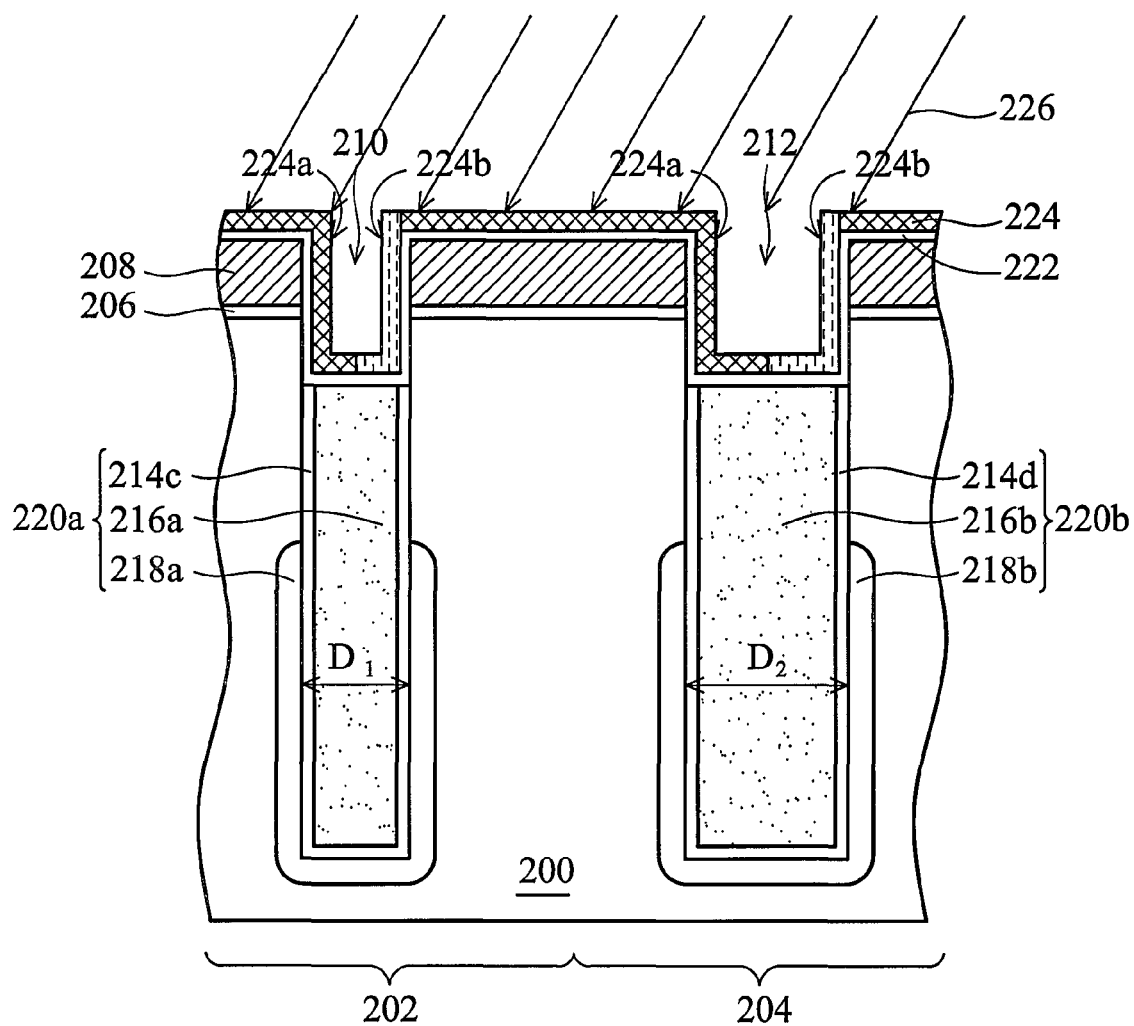
Figure 3E:
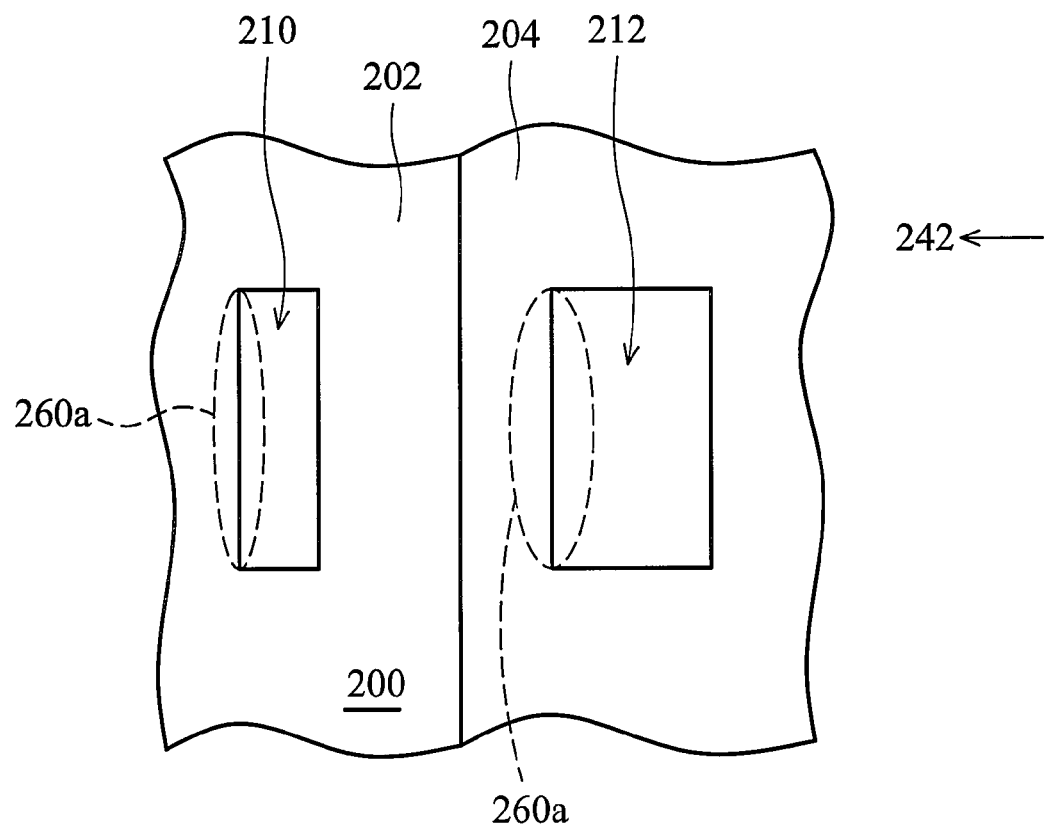
FIG. 3e shows a schematic top view of FIG. 3d.

Next, as shown in FIG. 3d and FIG. 3e, a first implantation process 226 is performed along a first direction 242 to dope impurities into a first portion 260a of the conductive layer 224 in the first trench 210 and second trench 212, respectively. First direction 242 and a surface of the semiconductor substrate 200 may have an angle between 30° to 60°. A conductive layer 224a with doped impurities and a conductive layer 224b without doped impurities are formed in the device region 202 and testkey region 204 by a first implantation process 226, wherein the doped impurities may comprise boron (B), boron fluoride ($BF_2$), phosphorus (P) or arsenic (As).

Figure 3F:
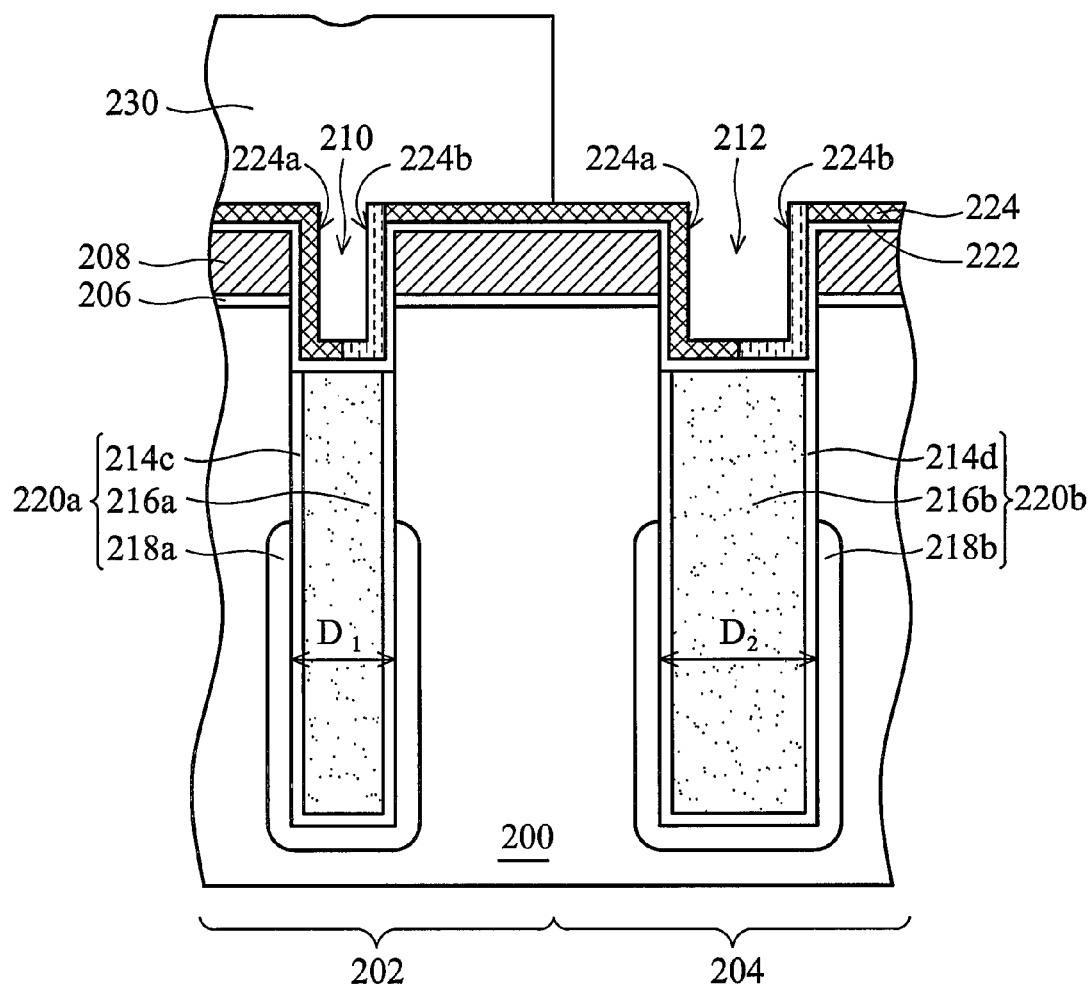
Figure 3G:
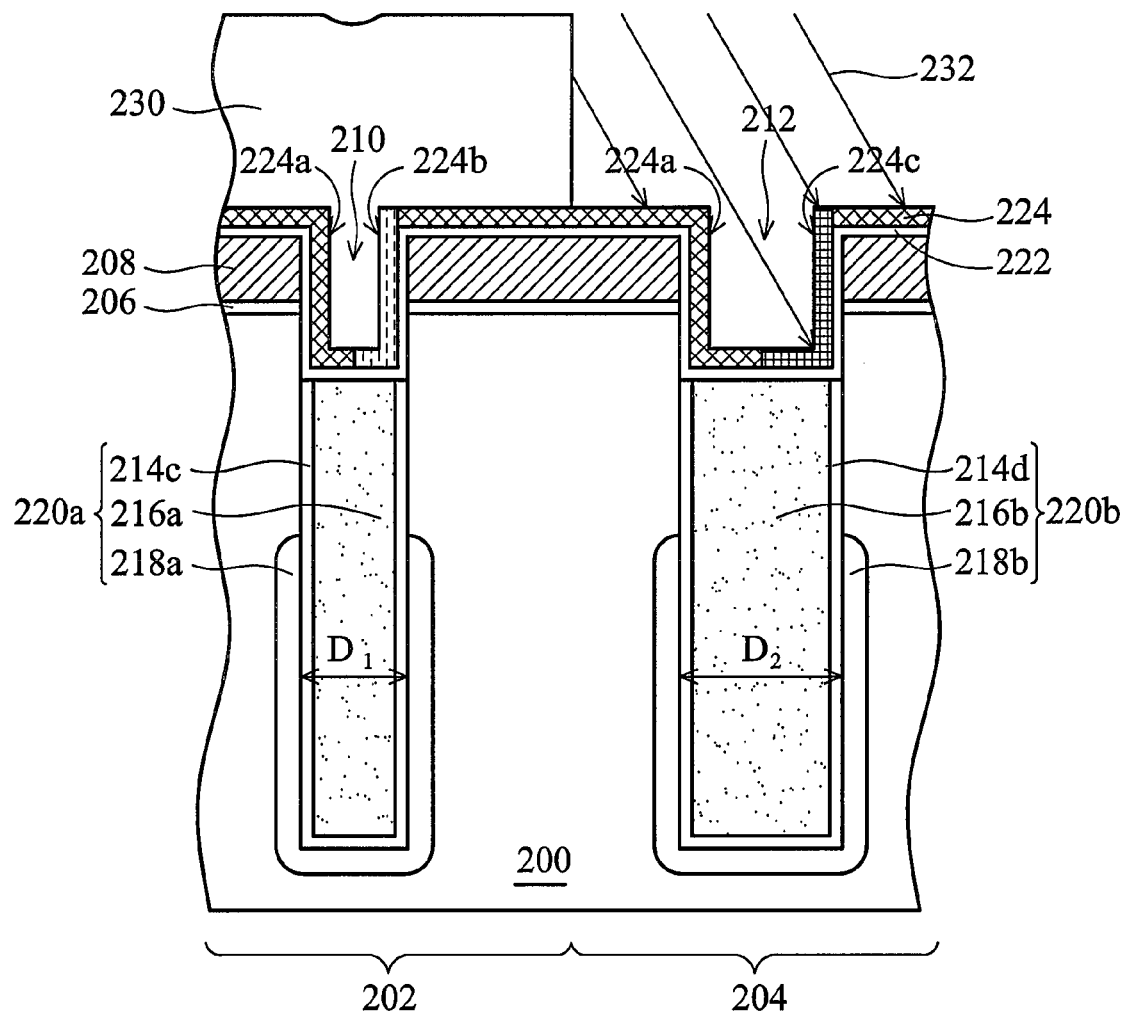
Figure 3H:
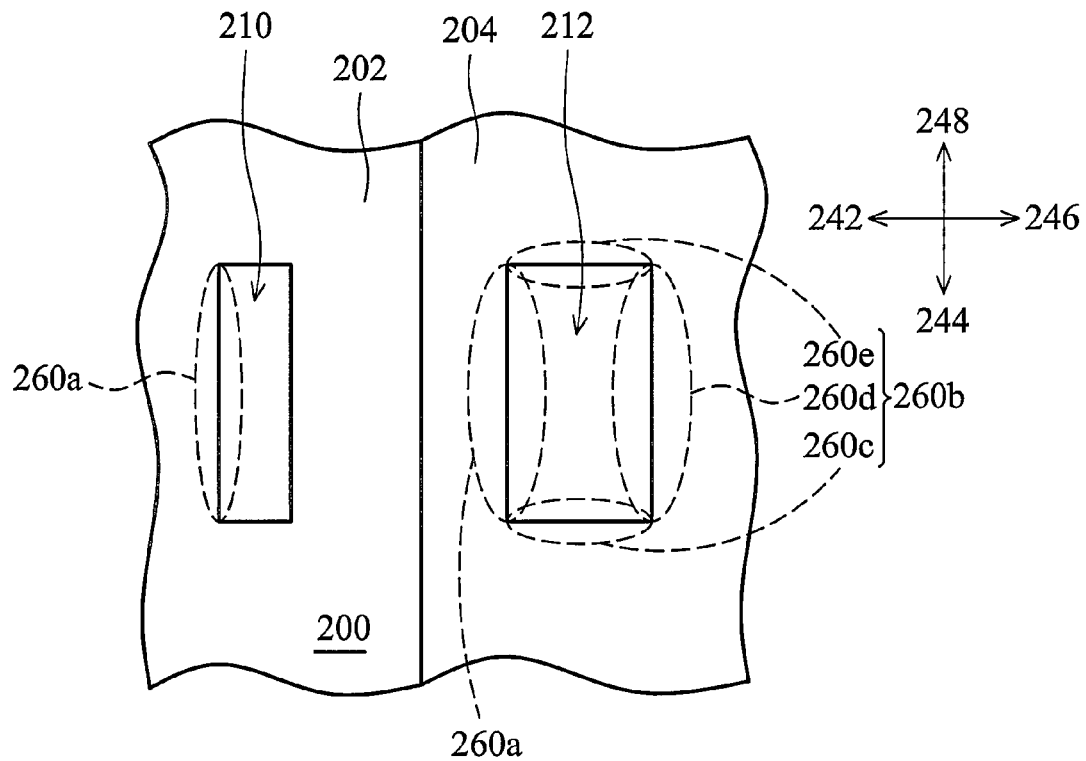
FIG. 3h shows a schematic top view of FIG. 3g.

Referring to FIG. 3f, a patterned masking layer 230 covers device region 202, exposing the second trench 212 in the testkey region 204. Patterned masking layer 230 may comprise a photoresist layer or a hard masking layer according to fabrication processes requirements. Next, as shown in FIG. 3g and FIG. 3h, a second implantation process 232 is performed to dope impurities into a second portion 260b of the conductive layer 224 in the second trench 212. In this embodiment, a second implantation process 232 may comprise three implantation steps. First, a first step is performed along a second direction 244 to dope impurities into a third portion 260c of the conductive layer 224 in the second trench 212, wherein second direction 244 is substantially perpendicular to the first direction 242. Next, a second step is performed along a third direction 246 to dope impurities into a fourth portion 260d of the conductive layer 224 in the second trench 212, wherein the third direction 246 is substantially perpendicular to the second direction 244. Finally, a third step is performed along a fourth direction 248 to dope impurities into a fifth portion 260e of the conductive layer 224 in the second trench 212, wherein the fourth direction 248 is substantially perpendicular to the third direction 246. The second implantation process 232 is performed to form a conductive layer 224c with doped impurities into the testkey region 204, wherein the doped impurities may comprise boron (B), boron fluoride ($BF_2$), phosphorus (P) or arsenic (As). In this embodiment, the first implantation process 226 and second implantation process 232 make doped impurities disperse uniformly in the conductive layer 224 in the second trench 212. Conductive layer 224 with doped impurities in the second trench 212 has a second etching selectivity higher than the first etching selectivity. The patterned masking layer 230 is then removed.

Figure 3I:
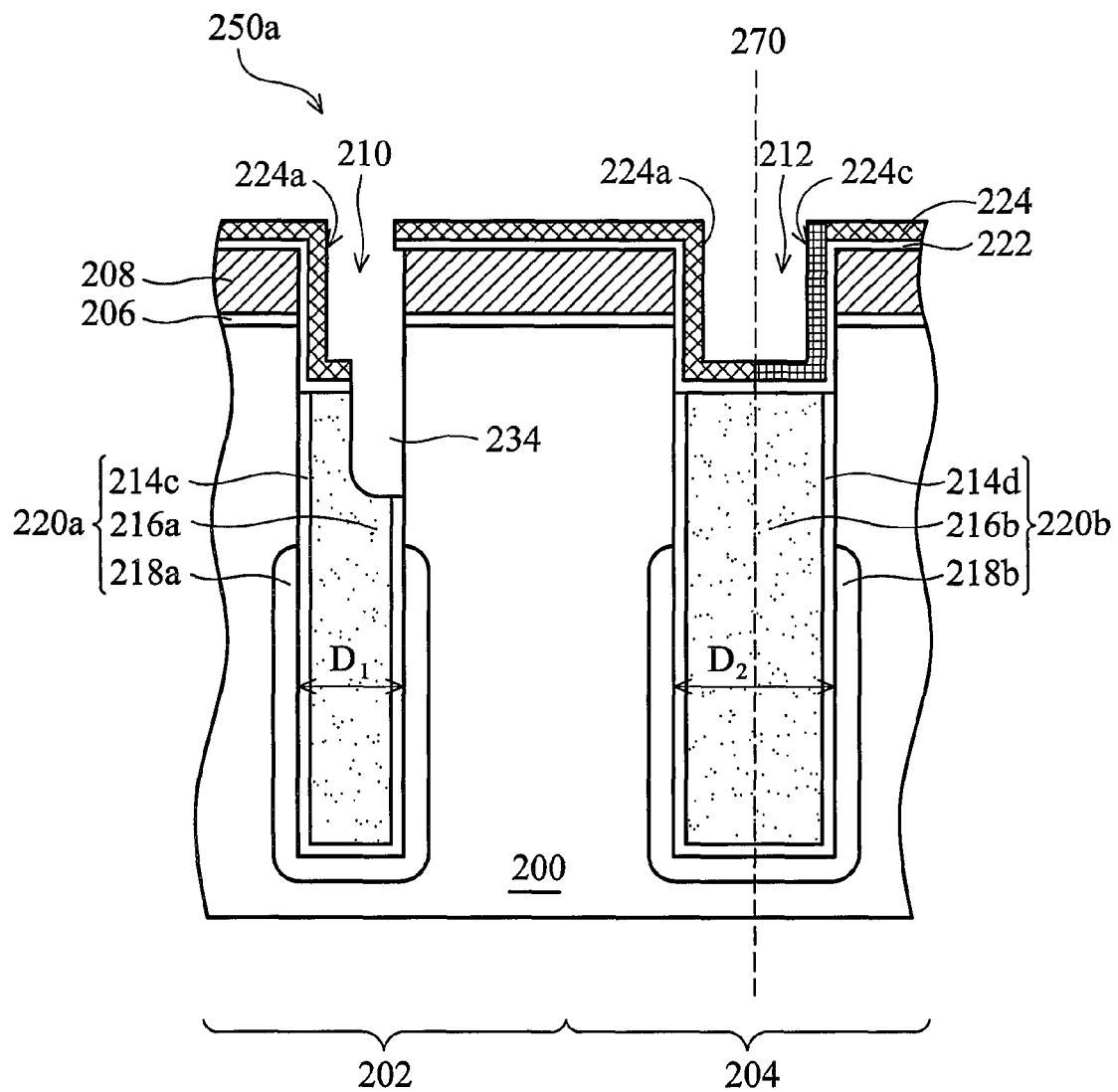

Referring to FIG. 3i, a wet etching process is performed in the first trench 210 to remove a portion of the conductive layer 224b without doped impurities, a portion of the insulating layer 222 underlying the removed conductive layer 224b and a portion of the first trench capacitor 220a underlying the removed insulating layer 222. A recess 234 is thus formed in the first trench capacitor 220a. In this embodiment, an etchant used for the wet etching process may comprise ammonium hydroxide ($NH_4OH$) dissolving in hydrogen oxide ($H_2O$). The etchant comprising $NH_4OH$ and $H_2O$ preferably has a volume ratio between 1:100 to 1:200. Ammonium hydroxide ($NH_4OH$) of the etchant preferably comprises industrial $NH_4OH$ with a weight concentration between 35 wt % to 45 wt %, preferably 40 wt %. In this embodiment, the conductive layer 224a in the first trench 210 with doped impurities has a second etching selectivity, and the conductive layer 224b in the first trench 210 without doped impurities has the first etching selectivity lower than the second etching selectivity as shown in FIG. 3g. Therefore, the etching selectivity of the conductive layer 224a in first trench 210 is higher than that of the conductive layer 224b in first trench 210. Meanwhile, as shown on FIG. 3i, both conductive layers 224a and 224c on the testkey area 204 with doped impurities have the second etching selectivity. Therefore, the conductive layer 224 in the second trench 212 has etching selectivity higher than that of the conductive layer 224b in the first trench 210. After performing the wet etching process, a recess 234 is formed in the first trench capacitor 220a on the device region 202. Meanwhile, the conductive layer 224 in the second trench 212 on the testkey area 204 is not removed by the wet etching process, having a symmetric profile to a central axis 270. Thus, the formation of an exemplary embodiment of the semiconductor device 250a is complete.

An exemplary embodiment of the semiconductor device 250a uses an additional implantation process (second implantation process 232) to make the conductive layer 224 in the second trench 212 on the testkey region 204 to have doped impurities. Therefore, the conductive layer 224 in the second trench 212 may have an etching selectivity higher than that of the conductive layer 224b in the first trench 210. After performing the wet etching process, the conductive layer 224 on the testkey region 204, which is a region for forming alignment marks or overlay marks, is not removed by the wet etching process, thus has a symmetric profile to a central axis 270. Therefore, misalignment or overlay error problems due to asymmetric profiles of alignment marks or overlay marks on the testkey region can be avoided using the photolithography processes of the invention. Thus, fabricating yield and device reliability of a semiconductor device can be improved.

FIGS. 4a and 4c are cross sections showing another exemplary embodiment of a process of fabricating a semiconductor device of the invention. The same elements as shown in FIGS. 3a to 3c are not repeated again for brevity.

Referring to FIG. 4a and FIG. 4b, a patterned masking layer 236 is formed for covering the testkey region 204. Patterned masking layer 236 may comprise a photoresist layer or a hard masking layer according to fabrication processes requirements. Next, a first implantation process 226 is performed along a first direction 242 to dope impurities into a first portion 260a of the conductive layer 224 in the first trench 210. First direction 242 and a surface of the semiconductor substrate 200 may have an angle between 30° to 60°. A conductive layer 224a with doped impurities and a conductive layer 224b without doped impurities are formed on the device region 202 by a first implantation process 226, wherein the doped impurities may comprise boron (B), boron fluoride ($BF_2$), phosphorus (P) or arsenic (As). Patterned masking layer 236 covering the second trench 212 is used to block impurities from the first implantation process 226 doping of the conductive layer 224 in the second trench 212. Therefore, the conductive layer 224 in the second trench 212 may retain a first etching selectivity. Next, the patterned masking layer 236 is then removed.

Referring to FIG. 4c, a wet etching process is performed to remove a portion of the conductive layer 224b without doped impurities, underlying the insulating layer 222 and underlying the first trench capacitor 220a, which are in the first trench 210. The aforementioned wet etching process is also removed the entire conductive layer 224, the entire underlying insulating layer 222 and a portion of the underlying second trench capacitor 220b, which are in the second trench 210. A recess 238a and a recess 238b are thus formed in the first trench capacitor 220a and second trench capacitor 220b, respectively. In this embodiment, an etchant used for the wet etching process may comprise ammonium hydroxide ($NH_4OH$) dissolving in hydrogen oxide ($H_2O$). The etchant comprising $NH_4OH$ and $H_2O$ preferably has a volume ratio between 1:100 to 1:200. Ammonium hydroxide ($NH_4OH$) of the etchant preferably comprises industrial $NH_4OH$ with a weight concentration between 35 wt % to 45 wt %, preferably 40 wt %. In this embodiment, the conductive layer 224a in the first trench 210 with doped impurities has the second etching selectivity, and the conductive layer 224b in the first trench 210 without doped impurities has the first etching selectivity lower than the second etching selectivity as shown in FIG. 4a. Therefore, the etching selectivity of the conductive layer 224a in the first trench 210 is higher than that of the conductive layer 224b in the first trench 210. Meanwhile, as shown on FIG. 4a, the conductive layer 224 in the second trench 212 without doped impurities maintains a first etching selectivity. As shown in FIG. 4b, after performing the wet etching process, recess 238a is formed in the first trench capacitor 220a on the device region 202, while recess 238b is formed in the second trench capacitor 220b. Meanwhile, the second trench capacitor 220b on the testkey region 204 may have a symmetric profile to a central axis 270. Thus, the formation of another exemplary embodiment of the semiconductor device 250b is complete.

Another exemplary embodiment of semiconductor device 250b uses a patterned masking layer 236 covering a second trench 212 on the testkey region 204 to block doped impurities of the first implantation process 226 doping into the conductive layer 224 in the second trench 212. Therefore, the conductive layer 224 in the second trench 212 may retain a first etching selectivity. After performing the wet etching process, the entire conductive layer 224, entire underlying insulating layer 222 and a portion of the underlying second trench capacitor 220b, which are in the second trench 210, are removed. A recess 238b formed in the second trench capacitor 220b on the testkey region 204, which is a region for forming alignment marks or overlay marks, has a symmetric profile to a central axis 270. Misalignment or overlay error problems due to asymmetric profiles of alignment marks or overlay marks on the testkey region can be avoided using the photolithography processes of the invention. Therefore, fabricating yield and device reliability of a semiconductor device can be improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating the semiconductor device, comprising:

providing a semiconductor substrate comprising a device region and a testkey region;

forming a first trench in the device region and a second trench in the testkey region;

conformably forming a conductive layer which has a first etching selectivity in the first trench and in the second trench;

forming a patterned masking layer to cover the second trench to retain the first etching selectivity of the conductive layer in the second trench; and forming a doped region and an undoped region in the conductive layer in the first trench, wherein the doped region of the conductive layer in the first trench has a second etching selectivity higher than the first etching selectivity.

2. The method for fabricating the semiconductor device as claimed in claim 1, further comprising:

removing the patterned masking layer;

performing a wet etching process to remove the undoped region of the conductive layer.

3. The method for fabricating the semiconductor device as claimed in claim 2, wherein the conductive layer in the second trench has a symmetric profile relative to a central axis of the second trench.

4. The method for fabricating the semiconductor device as claimed in claim 1, wherein the impurities comprise boron, boron fluoride, phosphorus or arsenic.

5. The method for fabricating the semiconductor device as claimed in claim 1, wherein the second trench is a pattern comprising an alignment mark.

6. The method for fabricating the semiconductor device as claimed in claim 5, the pattern comprising an overlay mark.

7. The method for fabricating the semiconductor device as claimed in claim 1, wherein the conductive layer comprises amorphous silicon.

8. The method for fabricating the semiconductor device as claimed in claim 1, wherein the conductive layer comprises polysilicon.

9. The method for fabricating the semiconductor device as claimed in claim 1, wherein the second trench has a critical dimension larger than that of the first trench.

* * * * *